United States Patent
Then et al.

(10) Patent No.: US 10,658,475 B2
(45) Date of Patent: May 19, 2020

(54) TRANSISTORS WITH VERTICALLY OPPOSED SOURCE AND DRAIN METAL INTERCONNECT LAYERS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US); Paul B. Fischer, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/326,846
(22) PCT Filed: Sep. 30, 2016
(86) PCT No.: PCT/US2016/054642
§ 371 (c)(1),
(2) Date: Feb. 20, 2019
(87) PCT Pub. No.: WO2018/063278
PCT Pub. Date: Apr. 5, 2018

(65) Prior Publication Data
US 2019/0198627 A1 Jun. 27, 2019

(51) Int. Cl.
*H01L 29/417* (2006.01)
*H01L 29/20* (2006.01)
(Continued)

(52) U.S. Cl.
CPC .. *H01L 29/41766* (2013.01); *H01L 21/76895* (2013.01); *H01L 29/0847* (2013.01);
(Continued)

(58) Field of Classification Search
CPC ........... H01L 29/41766; H01L 29/0847; H01L 29/4236; H01L 49/2003; H01L 29/66462;
(Continued)

(56) References Cited

U.S. PATENT DOCUMENTS

2010/0259321 A1  10/2010 Tserng et al.
2013/0092947 A1  4/2013 Green et al.
(Continued)

FOREIGN PATENT DOCUMENTS

JP   2009224605 A   10/2009
WO  2018063278 A1   4/2018

OTHER PUBLICATIONS

International Search Report and Written Opinion received for PCT/US2016/054642, dated Jun. 30, 2017. 11 pages.
(Continued)

*Primary Examiner* — Seahvosh Nikmanesh
(74) *Attorney, Agent, or Firm* — Finch & Maloney PLLC

(57) ABSTRACT

Integrated circuit transistor structures are provided that may reduce capacitive parasitics by using metal on both sides (top and bottom) of a given integrated circuit transistor device layer. For example, in an embodiment, the drain metal interconnect is provided above the transistor device layer, and the source metal interconnect is provided below the transistor layer. Such a configuration reduces the parasitic capacitance not only between the source and drain metal interconnect layers, but also between the neighboring conductors of the drain metal interconnect layer, because the number of pass-thru conductors in the drain metal interconnect layer to access an upper conductor in the source metal interconnect layer is reduced. In other embodiments, the source metal interconnect remains above the transistor device layer, and the drain metal interconnect is moved to below the transistor device layer, to provide similar benefits. Techniques apply equally to any transistor type, including FETs and BJTs.

20 Claims, 7 Drawing Sheets

(51) Int. Cl.
    *H01L 29/423*     (2006.01)
    *H01L 29/778*     (2006.01)
    *H01L 29/08*     (2006.01)
    *H01L 29/66*     (2006.01)
    *H01L 21/768*     (2006.01)
    *H01L 29/735*     (2006.01)

(52) U.S. Cl.
    CPC ...... *H01L 29/2003* (2013.01); *H01L 29/4236* (2013.01); *H01L 29/66462* (2013.01); *H01L 29/7786* (2013.01); *H01L 29/735* (2013.01)

(58) Field of Classification Search
    CPC ............... H01L 29/7786; H01L 29/735; H01L 21/76895
    See application file for complete search history.

(56) References Cited

U.S. PATENT DOCUMENTS

| | | |
|---|---|---|
| 2015/0028384 A1 | 1/2015 | Cao et al. |
| 2015/0357323 A1 | 12/2015 | Vorhaus |
| 2017/0221814 A1* | 8/2017 | Kinoshita ............. H01L 23/535 |

OTHER PUBLICATIONS

International Preliminary Report on Patentability recieved for PCT/US2016/054642, dated Apr. 2, 2019. 7 pages.

\* cited by examiner

TRANSISTORS WITH VERTICALLY OPPOSED SOURCE AND DRAIN METAL INTERCONNECT LAYERS

BACKGROUND

A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called, the body or substrate, which can be used to bias the transistor. Metal-oxide-semiconductor FETs (MOSFETs) include a gate dielectric layer between the gate and the channel. A MOSFET-based integrated circuit fabrication process generally includes a front-end or front-end-of-line (FEOL) portion and a back-end or back-end-of-line (BEOL) portion. The front-end or FEOL is generally the first portion of the fabrication process where individual semiconductor devices such as transistors (e.g., MOSFETs) are formed, including all processes up to the deposition of metal contacts (sometimes referred to as TCN metal for source/drain contacts and GCN metal for gate contacts). The back-end or BEOL, not to be confused with far-back-end chip fabrication, is the second portion of integrated circuit fabrication includes forming the interconnect layers that operatively couple the individual semiconductor devices into a functional circuit. BEOL may include any number of metallization layers (e.g., metal layers M1-M9), depending on the target application or end use. There are a number of non-trivial issues associated with such integrated circuit fabrication processes.

DETAILED DESCRIPTION

Integrated circuit transistor structures are provided that enable the reduction of capacitive parasitics by using metal on both sides (top and bottom) of a given integrated circuit transistor device layer. For example, in an embodiment, the drain metal interconnect is provided above the transistor device layer, and the source metal interconnect is provided below the transistor layer. As will be appreciated in light of this disclosure, this configuration reduces the parasitic capacitance not only between the source and drain metal interconnect layers, but also between the neighboring conductors of the drain metal interconnect layer, because the number of pass-thru conductors in the drain metal interconnect layer to access an upper conductor in the source metal interconnect layer can be reduced. In other embodiments, the source metal interconnect remains above the transistor device layer, and the drain metal interconnect is moved to below the transistor device layer. Numerous other embodiments, configurations, and variations will be apparent in light of this disclosure.

General Overview

Figure 1A:
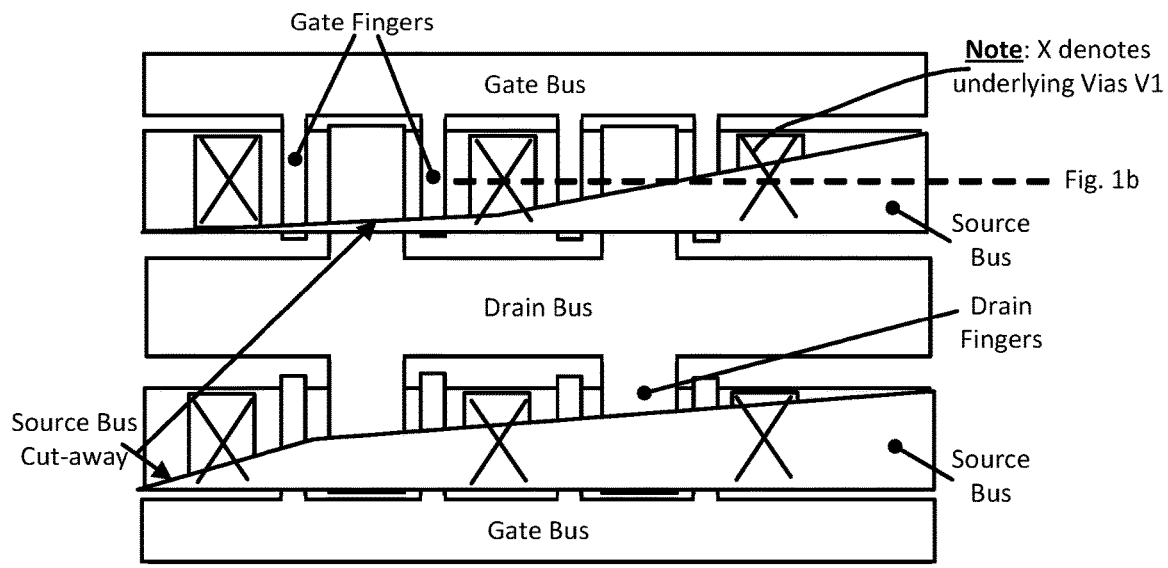
FIGS. 1a and 1b illustrate top down and cross-sectional views, respectively, of an integrated circuit transistor structure configured having both the source and drain interconnects on the same side of the transistor, and parasitic capacitance that results from such configurations.
Figure 1B:
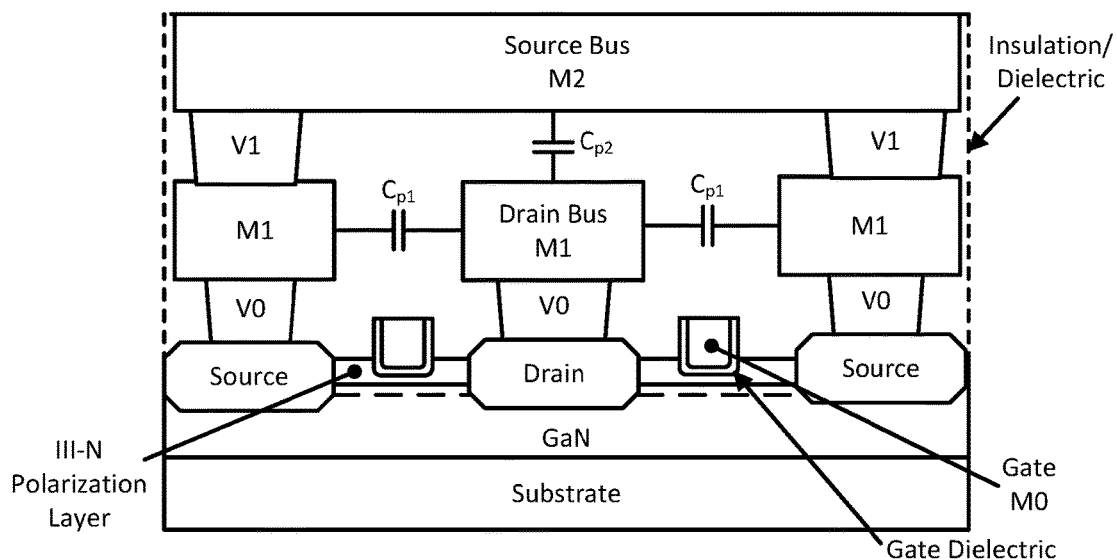

As previously noted, there are a number of non-trivial problems associated with typical MOSFET-based fabrication processes. One such problem is that parasitics associated with the interconnect metal deposited over the device layer can degrade transistor performance. These parasitics are, at least in part, the result of the overlaid source and drain metal interconnects above the device layer. In more detail, and with reference to FIGS. 1a and 1b, a typical MOSFET-based structure includes a device layer having a plurality of metal interconnect layers above it. FIG. 1a illustrates a top down partial view of an integrated circuit transistor structure. As can be seen, the transistor structure generally includes a gate bus, a drain bus, and a source bus. The source bus is shown in cut-away, so that features under the source bus can be seen. Further note that X depicts underlying vias that electrically connect the source bus to the next lower metal layer. FIG. 1b illustrates a cross-section partial side view of the transistor structure shown in FIG. 1a, taken at the 1b dashed line which generally runs parallel to and through one of the source buses. As can be seen, source and drain regions are formed on a gallium nitride (GaN) layer to either side of a gate stack that includes a gate dielectric and a gate metal, which is part of metal layer M0 in this example configuration. The polarization layer between the source/drain regions and the gate induces a 2DEG in the GaN layer to form a channel underneath the gate. In addition, metal layer M1 is connected to the device layer by way of a conductive via layer V0. The drain bus is in the metal layer M1. The second metal layer M2 is connected to metal layer M1 by way of conductive via layer V1. The source bus is in metal layer M2. Note that both metal layers M1 (drain bus) and M2 (source bus) are above the GaN transistor device layer. As can be further seen, such structures are prone to parasitic capacitance $C_{p1}$ between neighboring conductors in metal layer M1 as well as parasitic capacitance $C_{p2}$ between conductors in metal layer M1 and metal layer M2 (between the source bus and the drain bus, in this example configuration). As previously noted, such parasitics tend to degrade transistor performance.

Thus, and in accordance with an embodiment of the present disclosure, integrated circuit transistor structures are provided that enable the reduction of capacitive parasitics by using metal on both sides (top and bottom) of the transistor device layer. For example, according to one such embodiment, the drain metal interconnect is provided above the transistor device layer, and the source metal interconnect is moved to below the transistor layer, thereby eliminating or otherwise reducing the parasitic capacitance $C_{p2}$ between the source metal interconnect and drain metal interconnect. Moreover, the drain metal interconnect conductors can be wider apart, because there is no need for a pass-thru conductor in the drain metal interconnect layer to access an upper conductor in the source metal interconnect layer. As such, parasitic capacitance $C_{p2}$ between laterally neighboring conductors in the drain metal interconnect layer is reduced. Thus, the overall parasitic capacitance is reduced and the resistive-capacitance (RC) performance of the interconnect structure is improved. In other embodiments, the drain metal interconnect can be moved to below the transistor device layer. Numerous other embodiments, configurations, and variations will be apparent in light of this disclosure.

The metal on both sides (MOBs) configuration as provided herein can be implemented using a number of fabrications processes, as will be appreciated in light of this disclosure. In some embodiments, a multi-substrate transfer process. Such a process provides timely access to both the frontside and backside of the integrated circuit transistor structure being formed of the transistor layer. For instance, the source (or drain) interconnect metal can be formed below the transistor layer via a backside reveal process, where the frontside or top layer of the device layer is bonded to a second substrate and the first substrate upon which the device layer was formed is removed. The resulting structure can then be flipped and a backside metal interconnect layer can be formed including contacts to the source (or drain) regions, according to some embodiments. The backside metal interconnect layer is then bonded to a third substrate and the second substrate is removed. The resulting structure can then be flipped again and standard fabrication processing can continue to complete the structure.

Reducing capacitive parasitics is beneficial for many applications, as will be appreciated. For instance, radio frequency (RF) circuits such as RF receivers or so-called frontend architecture employed in mobile computing devices such as smartphones, laptops, and tablet computers typically employs a number of FET-based amplifiers expected to operate at frequencies in the gigahertz range. Capacitive parasitics can have a deleterious effect on performance of such RF circuits, including slow response times and signal degradation. Thus, the techniques provided herein can be used to reduce capacitive parasitic to improve RF device performance. Numerous other benefits and applications will be apparent in light of this disclosure. For instance, use of the techniques provided herein may reduce source/drain overlap, allow for thicker drains (in the y-direction), wider interconnect for drain (in the x-direction), and wider pitch of interconnect metals in the source and drain metal interconnect layers.

It is noted that frontside and backside designations are relative to a given orientation of the device layer, which changes during the multi-substrate transfer scheme, as the device layer is inverted or flipped. Further note that when the semiconductor structure is inverted, such that the device layer is effectively pointing down, the channels of the transistor devices in that device layer are, relatively speaking, above their respective gates, rather than below the gates as typically depicted. To this end, reference herein to "above" or "below" or "top" or "bottom" or "topside" or "bottom side" is not intended to necessarily implicate a limitation as to orientation of the structure. Rather, such terminology is simply used in a relative sense to consistently describe the structure as it exists in any one particular orientation. In reality, the structure can be turned and inverted and otherwise oriented as desired for a given application, and the relative terminology used herein can simply be adjusted to that actual orientation.

Use of the techniques and structures provided herein can be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools can be used to image a cross-section of material layers showing a device layer having a source metal interconnect layer on one side of the device layer and a drain metal interconnect layer on the other side of the device layer. Material composition analysis would also show such source/drain metal interconnect layers vertically opposed to one another with a device layer therebetween.

Structure and Methodology

Figure 2A:
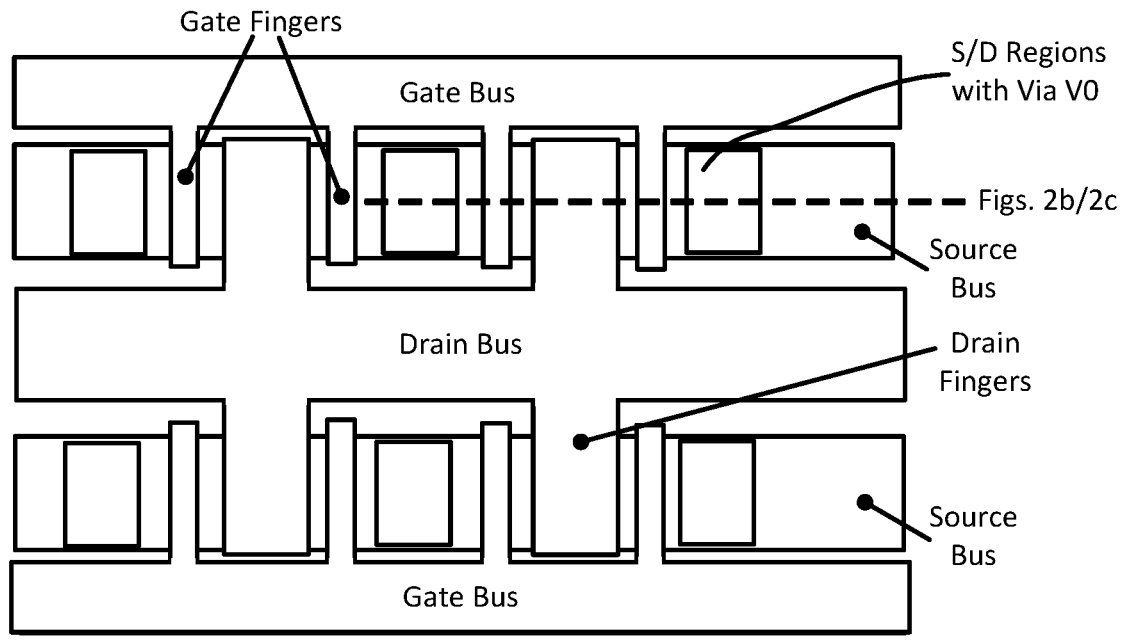
FIGS. 2a and 2b illustrate top down and cross-sectional views, respectively, of an integrated circuit transistor structure configured having a drain interconnect on the top side of the transistor and a source interconnect on the bottom side of the transistor, in accordance with an embodiment of the present disclosure.
Figure 2B:
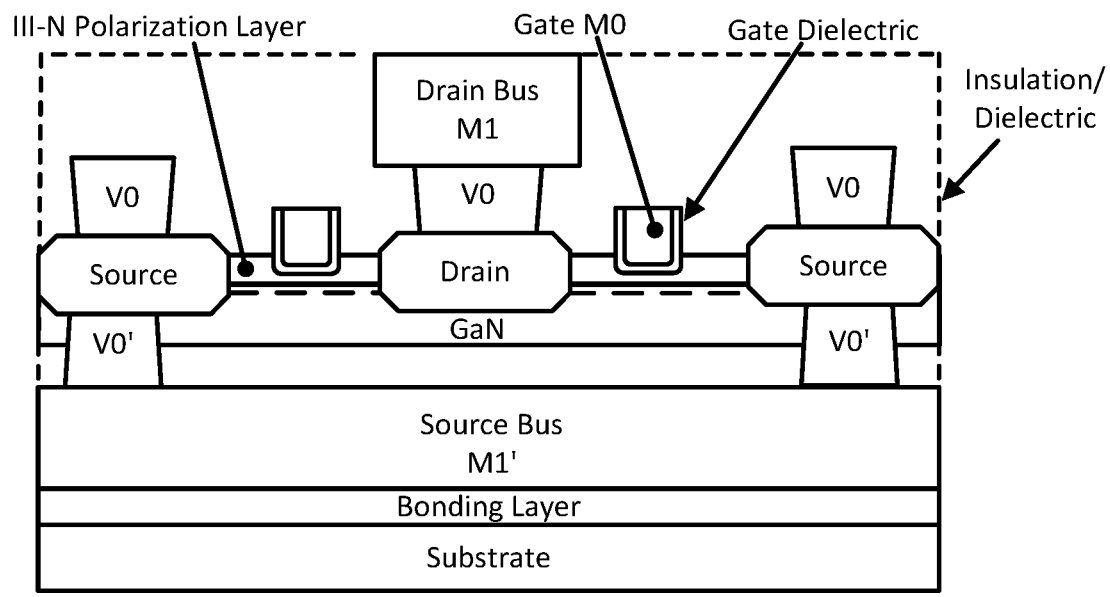

FIGS. 2a and 2b illustrate top down and cross-sectional views, respectively, of an integrated circuit transistor structure configured having a drain interconnect on the top side of the transistor and a source interconnect on the bottom side of the transistor, in accordance with an embodiment of the present disclosure. In particular, FIG. 2b shows a cross-section taken at the 2b/2c dashed line (indicated in FIG. 2a) which generally runs parallel to and through one of the source buses. As can be seen, the transistor structure generally includes a gate bus, a drain bus, and a source bus. The drain bus is above the transistor layer and the source bus below the device layer, in this example embodiment. As will be appreciated in light of this disclosure, because of this configuration having vertically opposed source and drain metal interconnect layers, note that there are no vias V1 (such as those shown in FIGS. 1a and 1b) electrically connecting a topside source bus to the next lower metal layer that includes a drain bus, for instance. Thus, the drain metal interconnect features can be bigger if so desired, and are otherwise less crowded in the drain metal interconnect layer, as will be further appreciated.

The example configuration shown includes two transistors that share a drain. Note, however, that any number of transistors can be used, and those transistors may or may not share contact points, depending on the target application of the given circuitry, as will be appreciated. The device layer of this example embodiment is implemented with gallium nitride (GaN) MOSFETs, although any other suitable transistor materials can be used to implement the device layer, and the present disclosure is not intended to be limited to any particular transistor configuration or type. Rather, the techniques can be broadly applied to any number of transistor types (e.g., MOSFETs, high electron mobility transistors or so-called HEMTs, heterostructure bipolar transistors or so-called HBTs, or other integrated transistor circuit structures) implemented in any number of semiconductor materials. So, for example, the device layer may be implemented group IV semiconductor materials such as silicon or germanium or silicon germanium (SiGe), or with group III-V semiconductor materials such as gallium arsenide (GaAs) or gallium indium arsenide (GaInAs), or group III-N semiconductor materials such as gallium nitride (GaN) or indium nitride (InN) or aluminum nitride (AlN) or indium gallium nitride (InGaN) or aluminum gallium nitride (AlGaN) or aluminum indium nitride (AlInN) or aluminum indium gallium nitride (AlInGaN), to name a few examples. In any such cases, the source and drain interconnect metal layers (or emitter and collector interconnect metal layers, as the case may be) are vertically opposed to one another with a device layer therebetween. Note that, for purposes of simplicity, source, drain, and gate are used herein to also refer to emitter, collector, and base of bipolar junction transistors (BJTs). In some embodiments, GaN may be particularly well-suited for the device layer because of its wide bandgap, high critical breakdown electric field, and high electron saturation, for example. For instance, embodiments employing a GaN-based device layer may be particularly well-suited for high-voltage and high-frequency applications, such as in the context of RF power amplifiers and low-noise amplifiers, to name some example devices. In some embodiments, the device layer may have a multilayer structure (e.g., buffer layers) and/or may or may not include grading (e.g., increasing and/or decreasing) with respect to one or more materials in at least a portion of the device layer, so as to, for example, improve lattice match to initial substrate during the fabrication process. In some embodiments, the device layer may be doped with another material, such as with one or more suitable p-type or n-type dopants, for example. The thickness (the dimension in the Y direction) of the device layer will vary from one embodiment to the next, but in some example cases is in the range of 20 nm and 2 microns, although any suitable geometries can be used. The device layer can be formed using any suitable deposition techniques, such as epitaxial blanket deposition of single crystal GaN (or other desired device layer material), or a so-called lateral epitaxial overgrowth (LEO) process where single crystal GaN is grown out of a shallow trench isolation (STI) trench so that it extends laterally over the field surface of the STI layer. Any number of device layer configurations can be used in accordance with an embodiment of the present disclosure, as will be appreciated in light of this disclosure.

Figure 2C:
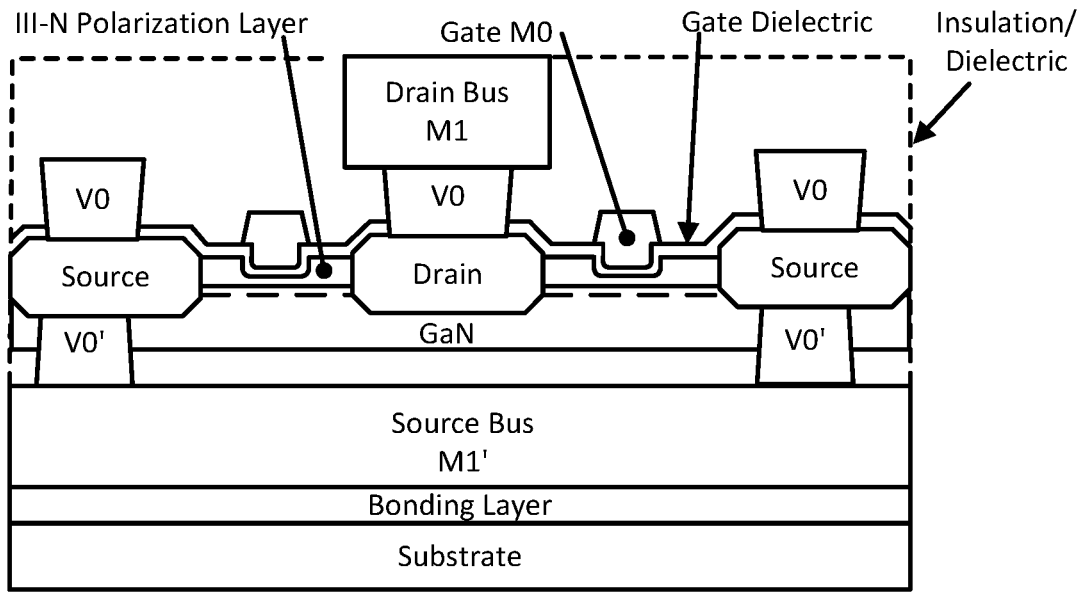
FIG. 2c illustrates a cross-sectional view of an integrated circuit transistor structure configured having a drain interconnect on the top side of the transistor and a source interconnect on the bottom side of the transistor, in accordance with another embodiment of the present disclosure.
Figure 2D:
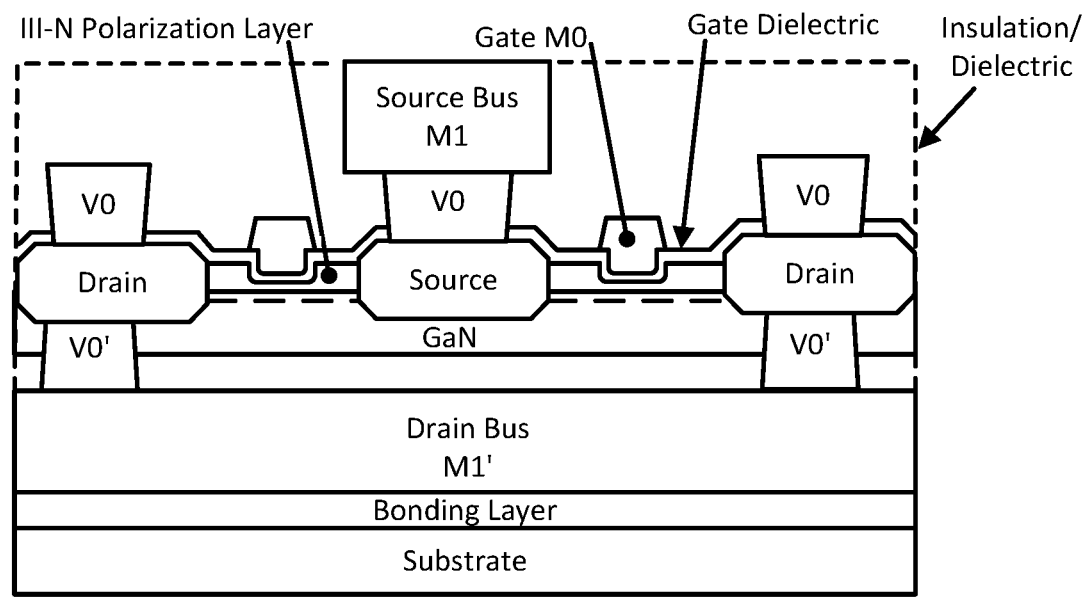
FIG. 2d illustrates a cross-sectional view of an integrated circuit transistor structure configured having a source interconnect on the top side of the transistor and a drain interconnect on the bottom side of the transistor, in accordance with another embodiment of the present disclosure.

Continuing with reference to the example embodiment shown in FIGS. 2a and 2b, source and drain regions are formed on a GaN layer to either side of a gate stack that includes a gate dielectric and a gate metal. The gate metal is part of metal layer M0 in this example configuration, and is sometimes referred to as the gate electrode or GCN (trench-based gate metal). In the example embodiment shown in 2b, the gate dielectric is disposed only on the sidewalls of the gate metal, and not on the neighboring surfaces of the polarization layer or source/drain regions. FIGS. 2c and 2d each shows an alternate configuration which will be discussed in turn. In any such cases, the gate metal and gate dielectric layer may be formed using any suitable techniques with any suitable materials and may be dimensioned as desired. In some embodiments, gate dielectric layer may include silicon dioxide and/or high-k dielectric material, or any other suitable gate dielectric material. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. In some embodiments, an annealing process may be carried out on the gate dielectric layer to improve its quality when a high-k material is used, for example. In some embodiments, the gate metal include, for example, polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN). In some embodiments, one or more material layers may be formed between the gate dielectric layer and the gate metal to, for example, increase the interface quality between the two features and/or to improve the electrical properties between the two features. Such intervening layers may include one or more work-function material layers, for example. In some embodiments, gate dielectric layer and/or gate metal may include a multi-layer structure of two or more material layers. In some embodiments, the gate dielectric layer and/or gate metal may include grading (e.g., increasing and/or decreasing) the content of one or more materials in at least a portion of the layer(s). The thickness (the dimension in the Y direction) of the gate dielectric layer and gate metal will vary from one embodiment to the next, but in some example cases is in the range of 2 nm to 10 nm (gate dielectric) and 40 nm to 100 nm (gate metal), but any suitable thicknesses can be used. Numerous gate stack configurations will be apparent in light of this disclosure and the present disclosure is not intended to be limited to any particular configuration.

The polarization layer between the source/drain regions and the gate induces a two-dimensional electron gas (2DEG) in the GaN layer to form a channel underneath the gate. In general, the polarization layer includes a material having a higher bandgap than the material of the underlying device layer, to form the 2DEG configuration, sometimes referred to as polarization doping. For instance, in some embodiments, the device layer includes GaN and the polarization layer includes AlN and/or AlGaN, for example. In other embodiments, the device layer may include AlGaN and the polarization layer may include GaN, AlN, and/or AlGaN, for example. In some embodiments, the polarization layer may have a multilayer structure including multiple III-V materials. In some such embodiments, one of the layers in the multilayer structure may be present to further increase carrier mobility in the transistor channel region and/or to improve compatibility (e.g., density of interface traps) between polarization layer and overlying layers (such as the gate dielectric layer), for example. The polarization layer may or may not include grading (e.g., increasing and/or decreasing) the content of one or more materials in at least a portion of the layer. The thickness (the dimension in the Y direction) of the polarization layer will vary from one embodiment to the next, but in some example cases is in the range of 0.1 to 100 nm (e.g., 0.5 to 5 nm), but any suitable thickness can be used. Other embodiments may have other non-2DEG channel configurations, such as a silicon channel between doped SiGe source/drain regions (impurity doping rather than polarization doping). Numerous channel configurations will be apparent in light of this disclosure and the present disclosure is not intended to be limited to any particular configuration.

The source/drain regions may be formed using any suitable techniques and with any suitable materials. For example, in some embodiments, the source/drain regions may be formed by implantation doping the source/drain regions of the device layer, or by an etch-and-replace process where the source/drain region of the device layer is recessed and then filled with a desired source/drain material. Note that although the source/drain regions are shown as one continuous portion, in some embodiments, the source/drain regions may include multiple portions, such as a bi-layer structure having a liner and cap configuration. Regardless of the configuration, in some embodiments, the source/drain material may be any suitable material depending on the device layer material and type of transistor. The source/drain material may be doped in an n-type or p-type manner, for example, using any suitable doping techniques. For instance, and continuing with the example embodiment where the device layer is GaN, the source/drain material can be, for instance, a III-V material or a III-N material. In some example such cases, for instance, the source/drain regions may include indium and nitrogen (e.g., InN or InGaN) and be doped in an n-type manner (e.g., with silicon, germanium, and/or tellurium) or a p-type manner (e.g., magnesium). In some embodiments, one or both of the source/drain regions may or may not include grading (e.g., increasing and/or decreasing) the content of one or more materials in at least a portion of one or both of the regions. The source/drain regions may sit on or be recessed into the device layer. In addition, the source/drain regions may extend above the device layer (and thus above the channel) in some embodiments, or be flush with the device layer in other embodiments. The dimensions of the source/drain regions will vary from one embodiment to the next, but in some example cases are in the range of 10 to 50 nm thick (y-direction) and 10 nm to 1000 nm wide (x-direction), but any suitable dimensions can be used. Group IV transistors may be configured differently, such as a silicon device layer having an impurity doped channel and SiGe source/drain regions doped in an n-type manner (e.g., with phosphorous) or a p-type manner (e.g., boron). Numerous source/drain configurations will be apparent in light of this disclosure and the present disclosure is not intended to be limited to any particular configuration.

The top of the source/drain regions each include metal contacts (generally designated as metal V0 in FIG. 2b) in this example embodiment, which can be formed using any suitable processes and with any suitable materials. Note that contact metal is applied to the top of the source regions (even though there is no connection made to that particular contact), for purposes of process simplicity (no special treatment of source regions while to drain region contacts are provided). In other example embodiments, however, note that no contact metal need to be applied to the top of the source regions, as those contacts are provided on the backside along with the source interconnect metal, as will be appreciated and discussed in turn. In some example cases, for instance, contact trenches are etched into an insulation/dielectric material overlying the source/drain regions to expose the underlying source/drain material. Then a contact metal such as aluminum, titanium, tungsten, or other appropriate conductor is deposited therein. The contact structure, sometimes referred to as TCN (source/drain metal in a trench), may include multiple layers such as resistance-reducing layers (e.g., aluminum), work function tuning layers (e.g., titanium nitride), liners (e.g., tantalum nitride), and a core or plug (e.g., tungsten). The insulation/dielectric material can be any suitable insulation material, such as silicon dioxide, silicon nitride, or silicon carbide, or a porous version of any of these.

As can be further seen in FIG. 2b, the drain bus is in metal layer M1 and is connected to the underlying drain region by way of a conductive via/contact structure in the same layer as the source contacts. Recall that these conductive via/contacts (generally designated as V0 in FIG. 2b) can be provisioned simultaneously over both the source and drain regions, in some embodiments. In any case, note how the drain bus metal interconnect in metal layer M1 is not as crowded (in the lateral, side to side direction) as the drain bus metal interconnect of metal layer M1 shown in FIG. 1b. This is because there is no need for M1 metal over the source regions, because the source bus is now below the device layer, according to this embodiment. Note that the top of the structure can be planarized (by a chemical mechanical planarization, or CMP process) to just above or flush with the drain bus, and cleaned in preparation for further processing (e.g., provisioning of additional metal layers M3 through Mx, where x is an integer ranging from 0 to 8).

The bottom of the source regions each include metal contacts (generally designated as metal V0' in FIG. 2b) in this example embodiment, which can be formed using any suitable processes and with any suitable materials, as previously discussed with reference to the topside source/drain contacts. That relevant discussion is equally applicable here. Note, however, that the backside source trenches may need to also pass through the device layer as well as the surrounding insulation/dielectric material, in some embodiments. In such cases, the trench etch can be modified as needed to etch the various materials through which the trench passes (e.g., silicon dioxide and GaN), and may include any suitable wet and/or dry etch processes.

As can be further seen in FIG. 2b, the backside source bus is implemented in a metal layer generally designated as M1', with the prime (') indicator intended to denote a backside metal interconnect layer that is vertically opposed to a corresponding frontside metal interconnect layer M1, wherein a device layer is between those two metal layers. As can be further seen, the source bus is connected to the source regions by way of the conductive via/contacts in the V0' layer. The opposite side of the source bus is bonded to an underlying substrate by way of a bonding layer. The source bus metal can be, for example, aluminum, titanium, tungsten, or other appropriate conductor material. The substrate can be any suitable substrate, such as a bulk silicon or GaAs substrate. The substrate may include a multilayer structure if so desired, in still other embodiments (e.g., to facilitate a desired compatibility between a given base layer and a desired bonding layer). In one example embodiment, the substrate is a bulk silicon substrate and the bonding material is silicon dioxide. The thickness of the bonding layer can vary from embodiment to the next, but in some cases in the range of 10 nm to 100 nm. Numerous substrate and bonding layer configurations will be apparent in light of this disclosure and the present disclosure is not intended to be limited to any particular configuration, as will be appreciated.

FIG. 2c illustrates a cross-sectional view of an integrated circuit transistor structure configured having a drain interconnect on the top side of the transistor and a source interconnect on the bottom side of the transistor, in accordance with another embodiment of the present disclosure. As can be seen, the example embodiment is similar to that shown in FIG. 2b, except that the gate dielectric only covers the lower portion of the gate metal and further conformally covers the field of the underlying polarization layer as well as part of the source/drain regions. Such a configuration may assist, for example, in preventing channel leakage into the insulation/dielectric material. The previous relevant discussion is equally applicable here.

FIG. 2d illustrates a cross-sectional view of an integrated circuit transistor structure configured having a source interconnect on the top side of the transistor and a drain interconnect on the bottom side of the transistor, in accordance with another embodiment of the present disclosure. As can be seen, the example embodiment is similar to that shown in FIG. 2c, except that source bus is above the device layer and the drain bus is below the device layer. Such a configuration may be more beneficial for certain circuit layouts than the reverse configuration shown in FIGS. 2b and 2c. The previous relevant discussion is equally applicable here.

Figure 3:
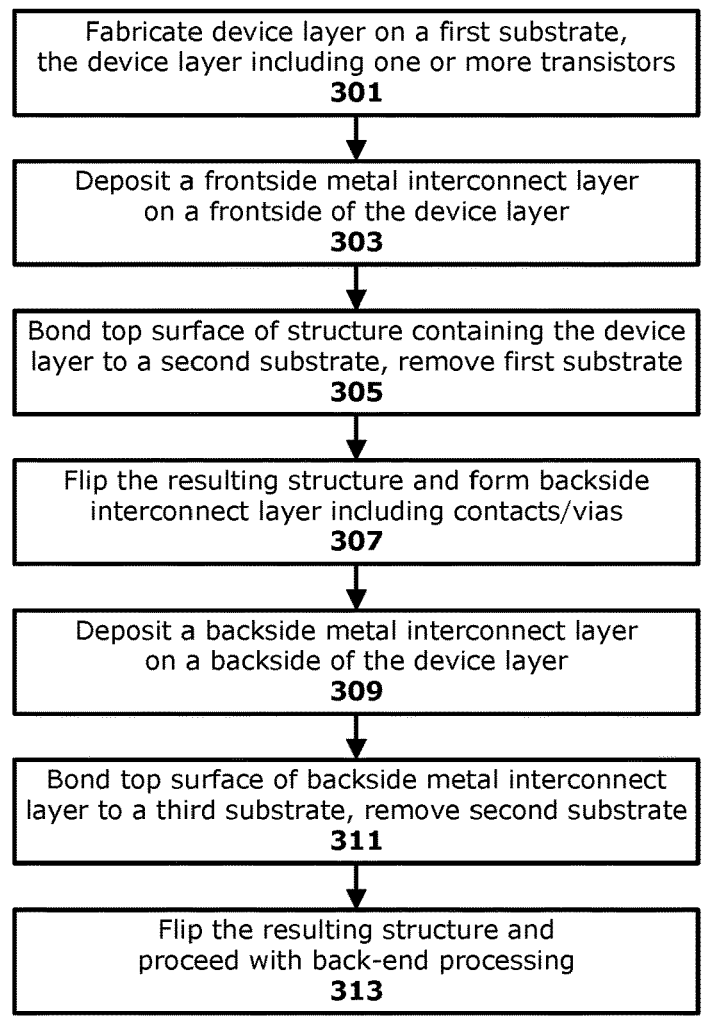
FIG. 3 illustrates a method for fabricating an integrated circuit transistor structure configured having vertically opposed source and drain metal interconnect layers, in accordance with an embodiment of the present disclosure.

FIG. 3 illustrates a method for fabricating an integrated circuit transistor structure configured having vertically opposed source and drain metal interconnect layers, in accordance with an embodiment of the present disclosure. As previously explained, the source or the drain may be above the device layer, and the other of the source or drain can be below the device layer. Any number of integrated circuit transistor types and material systems can be used with the techniques, as will be appreciated.

The method includes fabricating 301 a device layer on a first substrate, the device layer including one or more transistors. An example device layer is shown in FIG. 3a, and was previously described with reference to FIGS. 2a-d. Standard processing techniques can be used in forming the device layer, as will be appreciated in light of this disclosure. In some embodiments, formation of one or more of the layers is performed using metal-organic chemical vapor deposition (MOCVD), molecular-beam epitaxy (MBE) chemical vapor deposition (CVD), atomic layer deposition (ALD), physical vapor deposition (PVD), and/or any other suitable process as will be apparent in light of this disclosure. As previously described, III-N material systems are particularly well-suited to the methodologies provided herein when fabricating RF devices. A III-N material system generally includes compounds of one or more group III elements (e.g., aluminum, gallium, and/or indium), with nitrogen. Accordingly, III-N materials include, for example, GaN, InN, AlN, AlInN, AlGaN, InGaN, and AlInGaN. In one specific example embodiment, the fabricating at 301 includes: GaN deposition; trench isolation (etch, fill with oxide, and planarize); formation of regrown source/drain regions; gate stack and GCN formation; TCN formation; and via and interconnect metallization to the GCN and TCN structures formed directly on gate and source/drain regions. Numerous device layer configurations will be apparent in light of this disclosure and the present disclosure is not intended to be limited to any particular configuration.

Figure 4A:
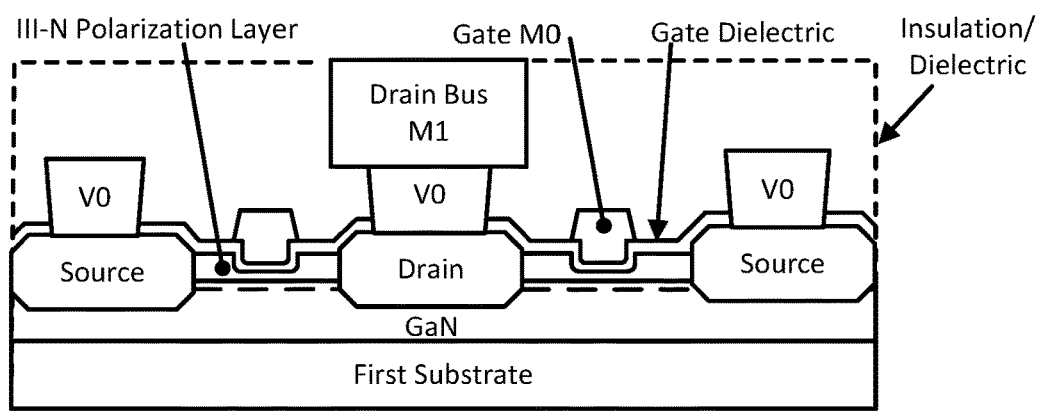
FIGS. 4a through 4f illustrate cross-sectional views of structures corresponding to various stages of the fabrication method of FIG. 3, in accordance with an embodiment of the present disclosure.
Figure 4B:
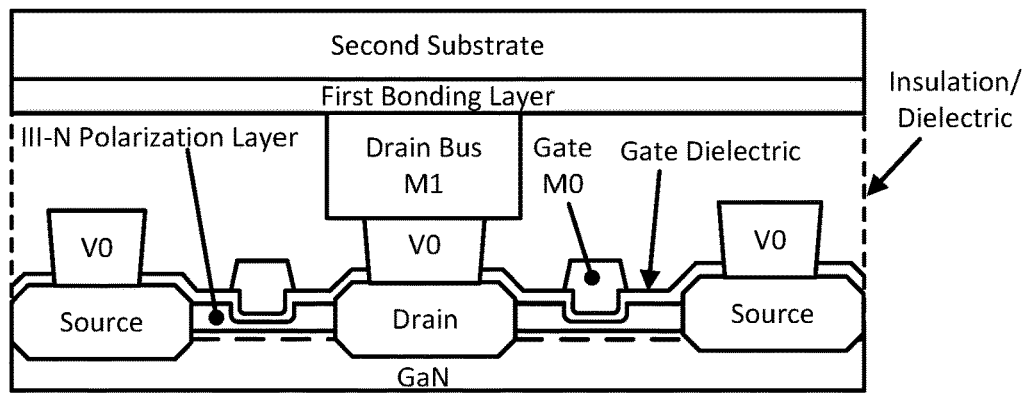

With further reference to FIG. 3, the method continues with depositing 303 a first metal interconnect layer on a frontside of the device layer, followed by bonding 305 the top surface of the structure containing the device layer to a second substrate, and removing the first substrate. An example resulting structure is shown in FIG. 4b, which shows the second substrate coupled to the device layer structure (which now includes the first metal interconnect layer, which is drain bus M1 in this example case) by way of a first bonding layer. The bonding can be carried out, for example, using an oxide bond, such as heat and oxygen are applied to form a silicon dioxide bonding layer between the structure and the second wafer. Note that the first bonding layer can be a different material than the insulation/dielectric material used elsewhere in the process (to fill and planarize the structure). The first substrate can be removed, for example, via a grinding process. The grinding process also serves as a backside reveal process of device layer (e.g., GaN). Although the grind can be more aggressive at the start of the removal process, it ultimately transitions to a backside polish and stops on the insulation/dielectric (e.g., to either side of the GaN layer, as shown with dashed lines in FIG. 4b).

Figure 4C:
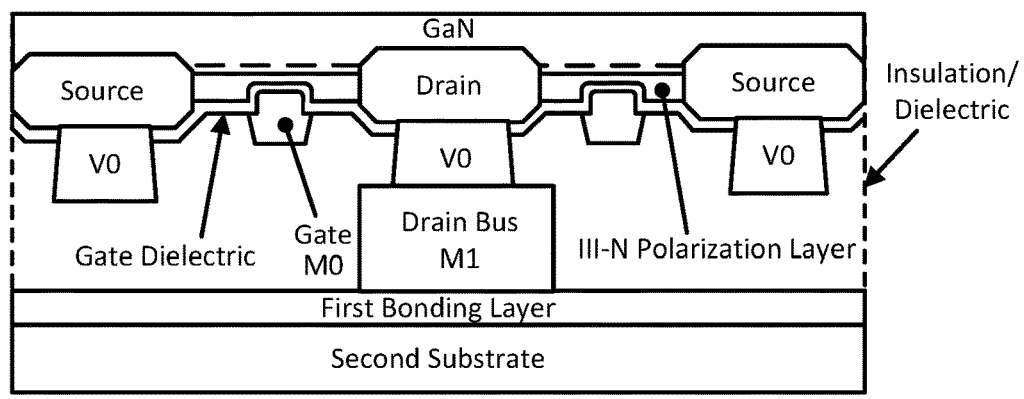
Figure 4D:
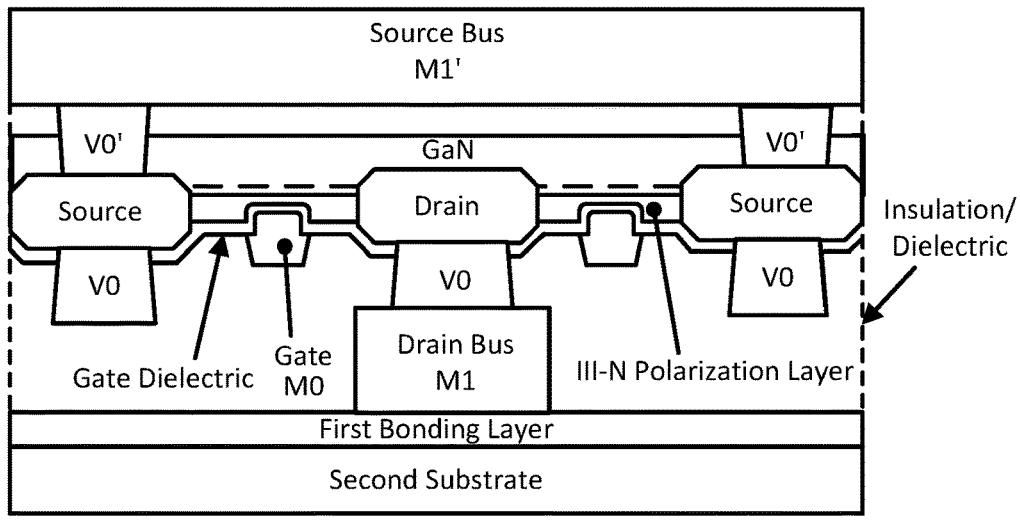

With further reference to FIG. 3, the method continues with flipping 307 the resulting structure and forming the backside interconnect layer including contacts/vias, and then depositing 309 a backside metal interconnect layer on the backside of the device layer. An example flipped structure is shown in FIG. 4c, and an example resulting structure after forming the backside contacts and depositing the backside metal interconnect layer is shown in FIG. 4d. As can be seen in this example embodiment, an insulation/dielectric layer is provisioned on the exposed backside of the device layer (e.g., GaN), and then trenches are patterned and etched into the insulation/dielectric layer and GaN layer to expose the underlying source regions. The metal contacts (TCN) and/or via structures are then provided in the contact trenches and are generally referred to as V0' in FIG. 4d. The backside metal interconnect layer is designated as the source bus (or the M1' metal layer) in this example case. Thus, backside source contacts and source metal interconnect layer are provided. Recall, in other embodiments, the drain interconnect metal is moved to the backside of the device layer. In such cases, backside drain contacts and drain metal interconnect layer would be so provided (the M1' metal layer would include the drain bus, and the M1 metal layer would include the source bus).

Figure 4E:
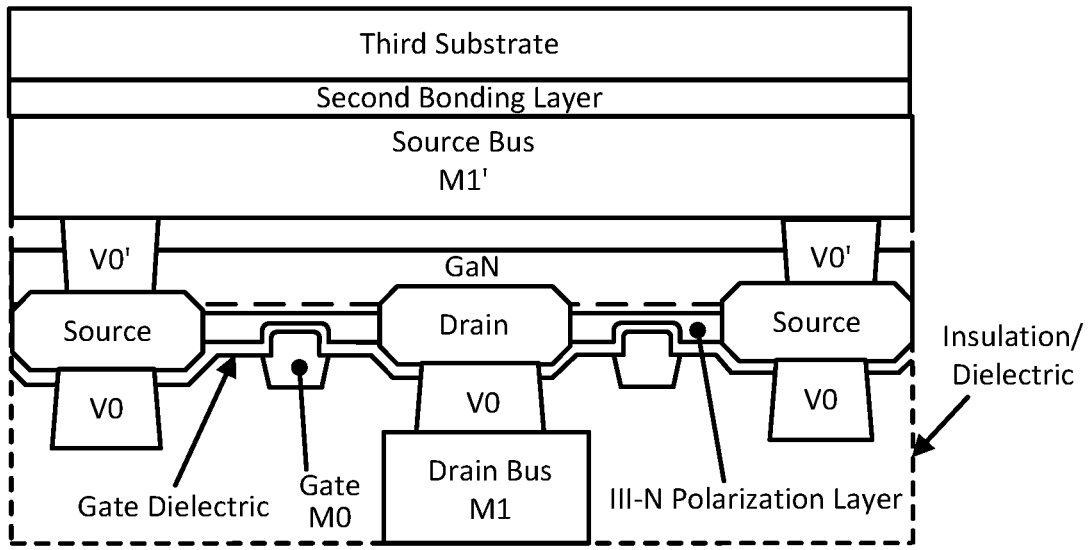

With further reference to FIG. 3, the method continues with bonding 311 the top surface of newly provisioned backside metal interconnect layer (source bus in metal layer M1', in this example case) to a third substrate, and removing the second substrate. An example resulting structure is shown in FIG. 4e, which shows the third substrate coupled to the backside metal interconnect layer by way of a second bonding layer. The bonding can be carried out in a similar fashion as described with respect to the second substrate bonding process, and that discussion is equally applicable here. As will be appreciated, any number of suitable bonding techniques can be used, and the present disclosure is not intended to be limited to any particular one. The second substrate can be removed, for example, via a grinding process similar to the first substrate removal process. The grinding process also serves as a frontside reveal process of the frontside metal interconnect layer (e.g., M1, which includes the drain bus in this example case). Although the grind can be more aggressive at the start of the removal process, it ultimately transitions to a frontside polish and stops on the insulation/dielectric (e.g., to either side of the drain bus, as shown with dashed lines in FIG. 4e).

Figure 4F:
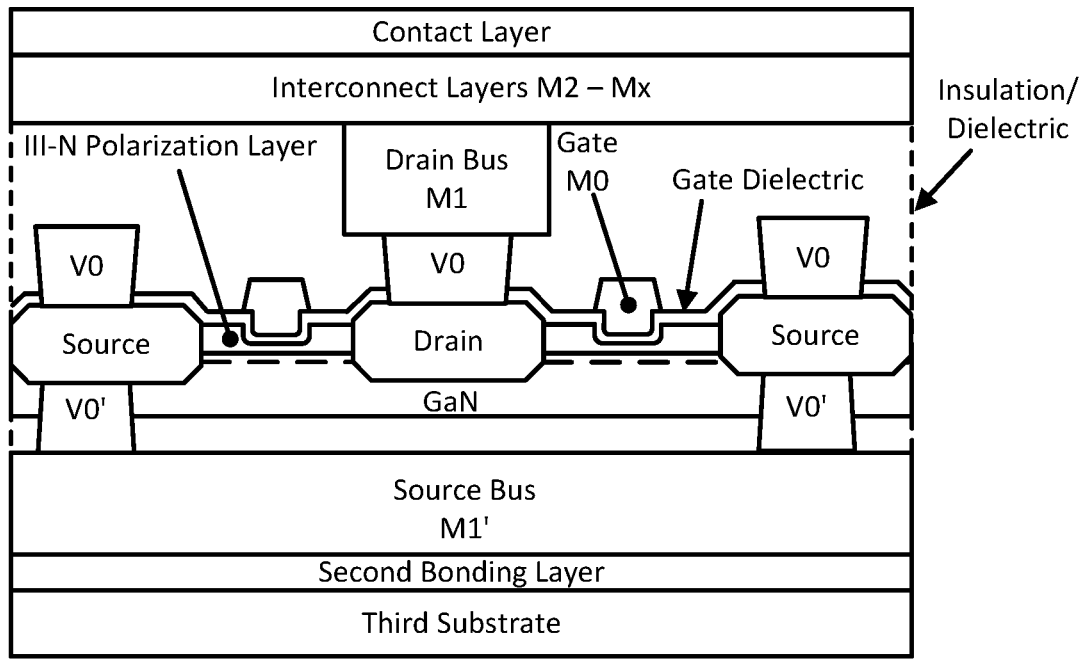

The method continues with flipping 313 the resulting structure, and proceeding with any further processing to complete the integrated circuit structure. This may include, for example, the provisioning of any number of further metal interconnect layers (sometimes called interlayer dielectric or ILD layers), and/or metal contact layers. An example resulting structure is shown in FIG. 4f, according to some embodiments. As can be seen, the structure include a number of additional frontside interconnect layers (generally designated as M2 through Mx) and a contact layer that may include one or more contact pads. The details and features of the further backend processing are specific to the particular circuit being formed, as will be appreciated.

Example System

Figure 5:
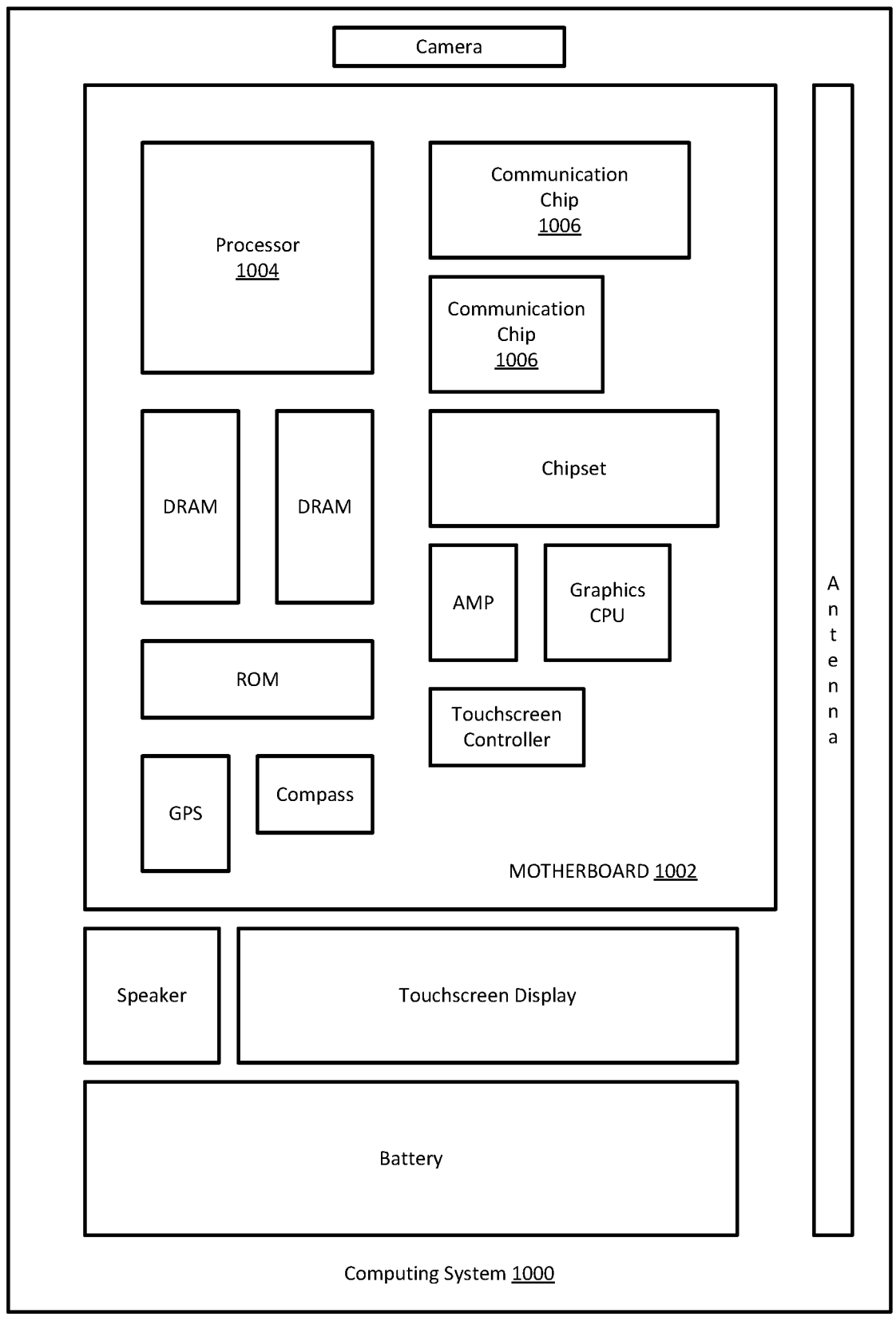
FIG. 5 illustrates an example computing system that may employ one or more integrated circuit structures configured in accordance with another embodiment of the present disclosure.

FIG. 5 illustrates an example computing system that may employ one or more integrated circuit structures configured in accordance with another embodiment of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM, RRAM, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., an integrated circuit structure having vertically opposed source and drain metal interconnect layers having a device layer therebetween, as variously provided herein). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., a processor chip or high-speed clocking circuit having source and drain metal interconnect layers formed above and below a given device layer in one fashion or another) as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., an RF receiver circuit or system-on-chip having source and drain metal interconnects formed above and below a given GaN transistor device layer) as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., RF receiver circuit having source and drain metal interconnects formed above and below a given transistor device layer) configured as variously described herein.

Many other embodiments and applications for the techniques provided herein will be apparent. For example, the techniques can be embodied in any number of RF integrated circuits, wireless communications integrated circuits, microelectromechanical systems (MEMS) integrated circuits, and power integrated circuits, and other such circuits that utilize RF filters, amplifiers, switches or those used in high frequency applications such as base stations, receivers, transmitters, transceivers, to name a few examples. As will be further appreciated, the techniques can be used, for example, for 5G communications and future generations of mobile technology, although numerous other applications will also be apparent.

Further Example Embodiments

The following examples pertain to further embodiments, from which numerous permutations and configurations will be apparent.

Example 1 is an integrated circuit, comprising: a substrate; a device layer formed above the substrate and including a transistor having a channel; a first metal interconnect layer above the device layer; and a second metal interconnect layer below the device layer and above the substrate.

Example 2 includes the subject matter of Example 1, wherein the first metal interconnect layer is a drain metal interconnect layer, and the second metal interconnect layer is a source metal interconnect layer, and there is no source interconnect metal in the drain metal interconnect layer.

Example 3 includes the subject matter of Example 1 or 2, wherein the device layer further includes source and drain regions adjacent the channel.

Example 4 includes the subject matter of Example 3, and further includes: a metal contact on a top surface of the drain region and that electrically connects the drain metal interconnect layer to the drain region; and a metal contact on a bottom surface of the source region and that electrically connects the source metal interconnect layer to the source region.

Example 5 includes the subject matter of Example 3 or 4, wherein each of the source region and the drain region has a top surface and a bottom surface, and each of the top and bottom surfaces has a metal contact thereon.

Example 6 includes the subject matter of Example 5, wherein the metal contact on the top surface of the drain region electrically connects the drain metal interconnect layer to the drain region, and the metal contact on the top surface of the source region is not in contact with any metal in the drain metal interconnect layer.

Example 7 includes the subject matter of any of the preceding Examples, wherein the device layer further includes a gate dielectric directly over the channel and a gate electrode over and in contact with the gate dielectric.

Example 8 includes the subject matter of Example 1, wherein the first metal interconnect layer is a source metal interconnect layer, and the second metal interconnect layer is a drain metal interconnect layer, and there is no drain interconnect metal in the source metal interconnect layer.

Example 9 includes the subject matter of Example 8, wherein the device layer further includes source and drain regions adjacent the channel.

Example 10 includes the subject matter of Example 9, and further includes: a metal contact on a top surface of the source region and that electrically connects the source metal interconnect layer to the source region; and a metal contact on a bottom surface of the drain region and that electrically connects the drain metal interconnect layer to the drain region.

Example 11 includes the subject matter of Example 8 or 9, wherein each of the source region and the drain region has a top surface and a bottom surface, and each of the top and bottom surfaces has a metal contact thereon.

Example 12 includes the subject matter of Example 11, wherein the metal contact on the top surface of the source region electrically connects the source metal interconnect layer to the source region, and the metal contact on the top surface of the drain region is not in contact with any metal in the source metal interconnect layer.

Example 13 includes the subject matter of any of the preceding Examples, wherein the channel is included in a group III-V semiconductor layer.

Example 14 includes the subject matter of Example 13, and further includes a polarization layer in direct contact with the group III-V semiconductor layer, wherein the channel includes a two-dimensional electron gas (2DEG) configuration.

Example 15 includes the subject matter of Example 14, wherein the group III-V semiconductor layer comprises gallium and nitrogen, and the polarization layer comprises aluminum.

Example 16 includes the subject matter of any of Examples 11 through 15, wherein the group III-V semiconductor layer comprises gallium and nitrogen.

Example 17 includes the subject matter of Example 1, wherein the channel is included in a group IV semiconductor layer.

Example 18 includes the subject matter of Example 17, wherein the channel is impurity doped.

Example 19 includes the subject matter of Example 17 or 18, wherein the group IV semiconductor layer comprises at least one of silicon, germanium, and carbon.

Example 20 includes the subject matter of Example 1 or any of Examples 13 through 19, wherein the first metal interconnect layer is an emitter metal interconnect layer, and the second metal interconnect layer is a collector metal interconnect layer, and there is no emitter interconnect metal in the collector metal interconnect layer.

Example 21 includes the subject matter of any of the preceding Examples, wherein the integrated circuit is included in a mobile computing device. In still other Examples, the integrated circuit is included in any type of computing device or test equipment or other electronic circuitry.

Example 22 includes the subject matter of any of the preceding Examples, wherein the integrated circuit is included in an RF receiver, an RF transmitter, or an RF transceiver. In a more general sense, the integrated circuit may be included in any type of RF circuitry or other high frequency and/or high power circuitry.

Example 23 includes an integrated circuit, comprising: a substrate; a device layer formed above the substrate and comprising gallium and nitrogen, the device layer including a transistor channel, a gate dielectric directly over the channel and a gate electrode over and in contact with the gate dielectric, and source and drain regions adjacent the channel; a polarization layer above and in contact with the device layer, the polarization layer comprising aluminum; a drain metal interconnect layer above the device layer; a source metal interconnect layer below the device layer and above the substrate; a metal contact on a top surface of the drain region and that electrically connects the drain metal interconnect layer to the drain region; and a metal contact on a bottom surface of the source region and that electrically connects the source metal interconnect layer to the source region; wherein there is no source interconnect metal in the drain metal interconnect layer.

Example 24 includes the subject matter of Example 23, wherein each of the source region and the drain region has a top surface and a bottom surface, and each of the top and bottom surfaces has a metal contact thereon.

Example 25 is a method for forming an integrated circuit, the method comprising: forming a device layer on a first substrate, the device layer including a transistor having a channel; forming a first metal interconnect layer over a frontside of the device layer to provide a first intermediate structure; bonding the first intermediate structure to a second substrate, and removing the first substrate to reveal a backside of the device layer; forming a second metal interconnect layer on the backside of the device layer to provide a second intermediate structure, wherein the device layer is between the first metal interconnect layer and the second metal interconnect layer; and bonding the second intermediate structure to a third substrate, and removing the second substrate to reveal a front side of the first metal interconnect layer.

Example 26 includes the subject matter of Example 25, wherein the first metal interconnect layer is a drain metal interconnect layer, and the second metal interconnect layer is a source metal interconnect layer, and there is no source interconnect metal in the drain metal interconnect layer.

Example 27 includes the subject matter of Example 25 or 26, wherein the device layer further includes source and drain regions adjacent the channel.

Example 28 includes the subject matter of Example 27, and further includes providing a metal contact on a top surface of the drain region and that electrically connects the drain metal interconnect layer to the drain region; and providing a metal contact on a bottom surface of the source region and that electrically connects the source metal interconnect layer to the source region.

Example 29 includes the subject matter of Example 27 or 28, wherein each of the source region and the drain region has a top surface and a bottom surface, and each of the top and bottom surfaces has a metal contact thereon.

Example 30 includes the subject matter of Example 29, wherein the metal contact on the top surface of the drain region electrically connects the drain metal interconnect layer to the drain region, and the metal contact on the top surface of the source region is not in contact with any metal in the drain metal interconnect layer.

Example 31 includes the subject matter of any of Examples 25 through 30, wherein the device layer further includes a gate dielectric directly over the channel and a gate electrode over and in contact with the gate dielectric.

Example 32 includes the subject matter of Example 25, wherein the first metal interconnect layer is a source metal interconnect layer, and the second metal interconnect layer is a drain metal interconnect layer, and there is no drain interconnect metal in the source metal interconnect layer.

Example 33 includes the subject matter of Example 32, wherein the device layer further includes source and drain regions adjacent the channel.

Example 34 includes the subject matter of Example 33, wherein a metal contact on a top surface of the source region and that electrically connects the source metal interconnect layer to the source region; and a metal contact on a bottom surface of the drain region and that electrically connects the drain metal interconnect layer to the drain region.

Example 35 includes the subject matter of Example 33 or 34, wherein each of the source region and the drain region has a top surface and a bottom surface, and each of the top and bottom surfaces has a metal contact thereon.

Example 36 includes the subject matter of Example 35, wherein the metal contact on the top surface of the source region electrically connects the source metal interconnect layer to the source region, and the metal contact on the top surface of the drain region is not in contact with any metal in the source metal interconnect layer.

Example 37 includes the subject matter of any of Examples 25 through 36, wherein the channel is included in a group III-V semiconductor layer.

Example 38 includes the subject matter of Example 37, and further includes a polarization layer in direct contact with the group III-V semiconductor layer, wherein the channel includes a two-dimensional electron gas (2DEG) configuration.

Example 39 includes the subject matter of Example 38, wherein the group III-V semiconductor layer comprises gallium and nitrogen, and the polarization layer comprises aluminum.

Example 40 includes the subject matter of any of Examples 37 through 39, wherein the group III-V semiconductor layer comprises gallium and nitrogen.

Example 41 includes the subject matter of Example 25, wherein the channel is included in a group IV semiconductor layer.

Example 42 includes the subject matter of Example 41, wherein the channel is impurity doped.

Example 43 includes the subject matter of Example 41 or 42, wherein the group IV semiconductor layer comprises at least one of silicon, germanium, and carbon.

Example 44 includes the subject matter of Example 25 or any of Examples 37 through 43, wherein the first metal interconnect layer is an emitter metal interconnect layer, and the second metal interconnect layer is a collector metal interconnect layer, and there is no emitter interconnect metal in the collector metal interconnect layer.

The foregoing description of example embodiments has been presented for the purposes of illustration and description. It is not intended to be exhaustive or to limit the present disclosure to the precise forms disclosed. Many modifications and variations are possible in light of this disclosure. For instance, reference to source, drain, and gate typically used for FETs are intended herein to also include emitter, collector, and base, respectively, of bipolar junction transistors (BJTs). Any such transistor types can be configured with vertically opposing source/emitter and drain/collector interconnect metal layers wherein the given transistor is between those two opposed metal interconnect layers. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit, comprising:
a device layer including a transistor, the transistor having a gate structure between a source region and a drain region;
a first interconnect layer above the device layer, the first interconnect layer comprising metal and connected to one of the source region or drain region of the transistor; and
a second interconnect layer below the device layer, the second interconnect layer comprising metal and connected to the other of the source region or drain region of the transistor.

2. The integrated circuit of claim 1 wherein the first interconnect layer is a drain interconnect layer, and the second interconnect layer is a source interconnect layer, and there is no source interconnect in the drain interconnect layer.

3. The integrated circuit of claim 1 wherein the gate structure includes a gate electrode and a gate dielectric, the gate electrode between the source region and the drain region, and the gate dielectric under the gate electrode and also at least partially on the source region and the drain region.

4. The integrated circuit of claim 3 further comprising:
a first contact on a top surface of the drain region and that electrically connects the drain interconnect layer to the drain region; and
a second contact on a bottom surface of the source region and that electrically connects the source interconnect layer to the source region;
wherein each of the first and second contacts comprise metal.

5. The integrated circuit of claim 1 wherein each of the source region and the drain region has a top surface and a bottom surface, and each of the top and bottom surfaces has a contact thereon, each contact comprising metal.

6. The integrated circuit of claim 5 wherein the contact on the top surface of the drain region electrically connects the first interconnect layer to the drain region, and the contact on the top surface of the source region is not in contact with any metal in the first interconnect layer.

7. The integrated circuit of claim 5 wherein the contact on the bottom surface of the source region electrically connects the second interconnect layer to the source region, and the contact on the bottom surface of the drain region is not in contact with any metal in the second interconnect layer.

8. The integrated circuit of claim 1 wherein the first interconnect layer is a source interconnect layer, and the second interconnect layer is a drain interconnect layer, and there is no drain interconnect in the source interconnect layer.

9. The integrated circuit of claim 5 wherein:
the contact on the top surface of the drain region electrically connects the first interconnect layer to the drain region;
the contact on the top surface of the source region is not in contact with any metal in the first interconnect layer;
the contact on the bottom surface of the source region electrically connects the second interconnect layer to the source region; and
the contact on the bottom surface of the drain region is not in contact with any metal in the second interconnect layer.

10. The integrated circuit of claim 8 further comprising:
a first contact on a top surface of the source region and that electrically connects the source interconnect layer to the source region; and
a second contact on a bottom surface of the drain region and that electrically connects the drain interconnect layer to the drain region;
wherein each of the first and second contacts comprise metal.

11. The integrated circuit of claim 8 wherein each of the source region and the drain region has a top surface and a bottom surface, and each of the top and bottom surfaces has a contact thereon, each contact comprising metal.

12. The integrated circuit of claim 11 wherein the contact on the top surface of the source region electrically connects the source interconnect layer to the source region, and the contact on the top surface of the drain region is not in contact with any metal in the source interconnect layer.

13. The integrated circuit of claim 1 wherein the gate structure is over a group III-V semiconductor layer.

14. The integrated circuit of claim 13 further comprising a polarization layer between the gate structure and the group III-V semiconductor layer, wherein a two-dimensional electron gas (2DEG) is inducible in the group III-V semiconductor layer under the gate structure.

15. The integrated circuit of claim 14 wherein the group III-V semiconductor layer comprises gallium and nitrogen, and the polarization layer comprises aluminum.

16. The integrated circuit of claim 1 wherein the gate structure is over a group IV semiconductor layer, the group IV semiconductor layer comprising at least one of silicon, germanium, and carbon.

17. An integrated circuit, comprising:
a substrate comprising silicon;
a device layer above the substrate and comprising gallium and nitrogen, the device layer including
a transistor including a first layer that comprises gallium and nitrogen,
a gate dielectric directly over the first layer and a gate electrode over and in contact with the gate dielectric, and
a source or drain region adjacent to the gate electrode, and the gate dielectric also over at least part of the source or drain region;
a second layer above and in contact with the first layer, the second layer comprising aluminum;
a first interconnect layer above the device layer;
a second interconnect layer below the device layer and above the substrate;
a first contact on a top surface of the drain region and that electrically connects the drain interconnect layer to the drain region; and
a second contact on a bottom surface of the source region and that electrically connects the source interconnect layer to the source region;
wherein there is no source interconnect metal in the drain interconnect layer.

18. The integrated circuit of claim 17 further comprising:
a third contact on the top surface of the source region, wherein the third contact is not in contact with any metal in the first interconnect layer;
a fourth contact on the bottom surface of the drain region, wherein the fourth contact is not in contact with any metal in the second interconnect layer;
wherein each of the first, second, third, and fourth contacts comprise metal.

19. A method for forming an integrated circuit, the method comprising:
forming a device layer on a first substrate, the device layer including a transistor having a source and drain regions adjacent a gate structure;
forming a first interconnect layer over a frontside of the device layer to provide a first intermediate structure;
bonding the first intermediate structure to a second substrate, and removing the first substrate to reveal a backside of the device layer;
forming a second interconnect layer on the backside of the device layer to provide a second intermediate structure, wherein the device layer is between the first interconnect layer and the second interconnect layer; and
bonding the second intermediate structure to a third substrate, and removing the second substrate to reveal a front side of the first interconnect layer.

20. The method of claim 19 wherein the first interconnect layer is a drain interconnect layer, and the second interconnect layer is a source interconnect layer, and there is no source interconnect metal in the drain interconnect layer, the method further comprising:
providing a first contact on a top surface of the drain region and that electrically connects the drain interconnect layer to the drain region; and
providing a second contact on a bottom surface of the source region and that electrically connects the source interconnect layer to the source region;
wherein each of the first and second contacts comprise metal.

* * * * *